United States Patent [19]
Olsson et al.

[11] Patent Number: 5,105,339
[45] Date of Patent: Apr. 14, 1992

[54] ARRANGEMENT FOR HOLDING A PRINTED CIRCUIT BOARD FIXED TO A FRAME

[75] Inventors: Rolf T. Olsson, Tullinge; Björn T. Kassman, Haninge; Karl-Gustaf Olsson, Stockholm; Stig C. Ernolf, Sollentuna, all of Sweden

[73] Assignee: Telefonaktiebolaget LM Ericsson, Stockholm, Sweden

[21] Appl. No.: 303,671
[22] PCT Filed: May 18, 1988
[86] PCT No.: PCT/SE88/00252
 § 371 Date: Jan. 23, 1989
 § 102(e) Date: Jan. 23, 1989
[87] PCT Pub. No.: WO88/09600
 PCT Pub. Date: Dec. 1, 1988

[30] Foreign Application Priority Data
May 20, 1987 [SE] Sweden .............................. 8702094

[51] Int. Cl.$^5$ .............................................. H05K 7/14
[52] U.S. Cl. .................................... 361/399; 361/413; 211/41; 439/565
[58] Field of Search ................ 361/391, 395, 399, 413, 361/415, 429; 211/41; 439/532, 562, 565, 716

[56] References Cited
U.S. PATENT DOCUMENTS
3,533,045  5/1968  Henschen .
3,652,899  3/1972  Henschen .
3,798,507  3/1974  Damon et al. .................... 211/41 X
4,134,632  1/1979  Lindberg et al. .................... 339/17
4,486,816 12/1984  Hope ................................... 361/399
4,595,249  6/1986  Oehlert et al. .................... 211/41 X

FOREIGN PATENT DOCUMENTS
2363963  3/1978  France .
1332565 10/1973  United Kingdom ................ 361/413

Primary Examiner—Leo P. Picard
Assistant Examiner—Paramita Ghosh
Attorney, Agent, or Firm—Burns, Doane, Swecker & Mathis

[57] ABSTRACT

An arrangement for retaining a printed circuit board on a frame is disclosed. Connectors are mounted on the printed circuit board and have electrical connection pins connected to electrical conductors in the printed circuit board. The connectors are elongate and have end portions bearing against the front of the printed circuit board. The frame has holders coacting with the end portions, and these holders retain the connectors and the printed circuit board. The frame has a tongue engaging against the front of the end portion, and a movable support is kept in engagement against the back of the printed circuit board behind the tongue with the aid of a screw. The forces occurring when a means complementary to the connector is connected to the connector are transferred to the frame by the connector, and the printed circuit board can thus be made thin.

3 Claims, 3 Drawing Sheets

ARRANGEMENT FOR HOLDING A PRINTED CIRCUIT BOARD FIXED TO A FRAME

TECHNICAL FIELD

The invention relates to an arrangement for retaining a printed circuit board (PCB) at a frame, said arrangement including connectors with electrical connection pins connected to electrical conductors in the PCB, the connectors being elongate and having end portions, the backs of which bear against the front of the PCB.

BACKGROUND ART

Electronic equipment, e.g. for computers or telephone exchanges, is in many applications supported mechanically by a rack which is divided into compartments. The back of each compartment has a PCB, to which a plurality of other so-called daughter PCBs in each compartment are connected. Compartments of this type are to be found described in a brochure from Teradyne Connection Systems, Inc, Nashua, NH, USA under the name of STRONGHOLD TM Card Guidance System. The brochure was printed in 1982 and revised in 1984 with the revision number REV.A 4-84. The implementation can be likened to a book shelf where the PCBs at the back of the compartments correspond to the back of the book case and the daughter PCBs correspond to the books. Each compartment has a frame retaining the PCB at the back of the compartment, and the daughter PCBs are thrust into grooved holders at the sides of the compartment. At their rear edges the daughter PCBs have electrical connection means, and the PCB at the back of the compartment has connectors with corresponding connection means, so that a daughter PCB can be connected to a connector when it is thrust into the compartment in its holders. The connectors have connection pins which are connected to electrical conductors in the PCB at the back of the compartment. The connectors are fastened to the PCB and, as mentioned, the latter is in turn fastened to the frame. The above described arrangement has the disadvantage that the PCBs at the back of the compartment must be very stable to withstand the forces occurring when a daughter PCB is thrust into its connector. The PCBs are therefore made thick, which increases expense in their manufacture. The different layers of electrical conductors in the PCB will be at a relatively large mutual spacing, resulting in that the capacitance between the layers will be small and the PCBs have poor impedance adaptability and poor cross talk properties when tightly packed.

DISCLOSURE OF INVENTION

The above-mentioned disadvantages are avoided by an arrangement in accordance with the invention in which the PCBs at the backs of the compartments are only subjected to small forces when the connectors on the PCBs are connected.

The arrangement has the characterizing features disclosed in the accompanying claims.

BRIEF DESCRIPTION OF DRAWINGS

One embodiment of the invention will now be described in more detail below and in connection with the drawing, where.

BEST MODE FOR CARRYING OUT THE INVENTION

Figure 1:
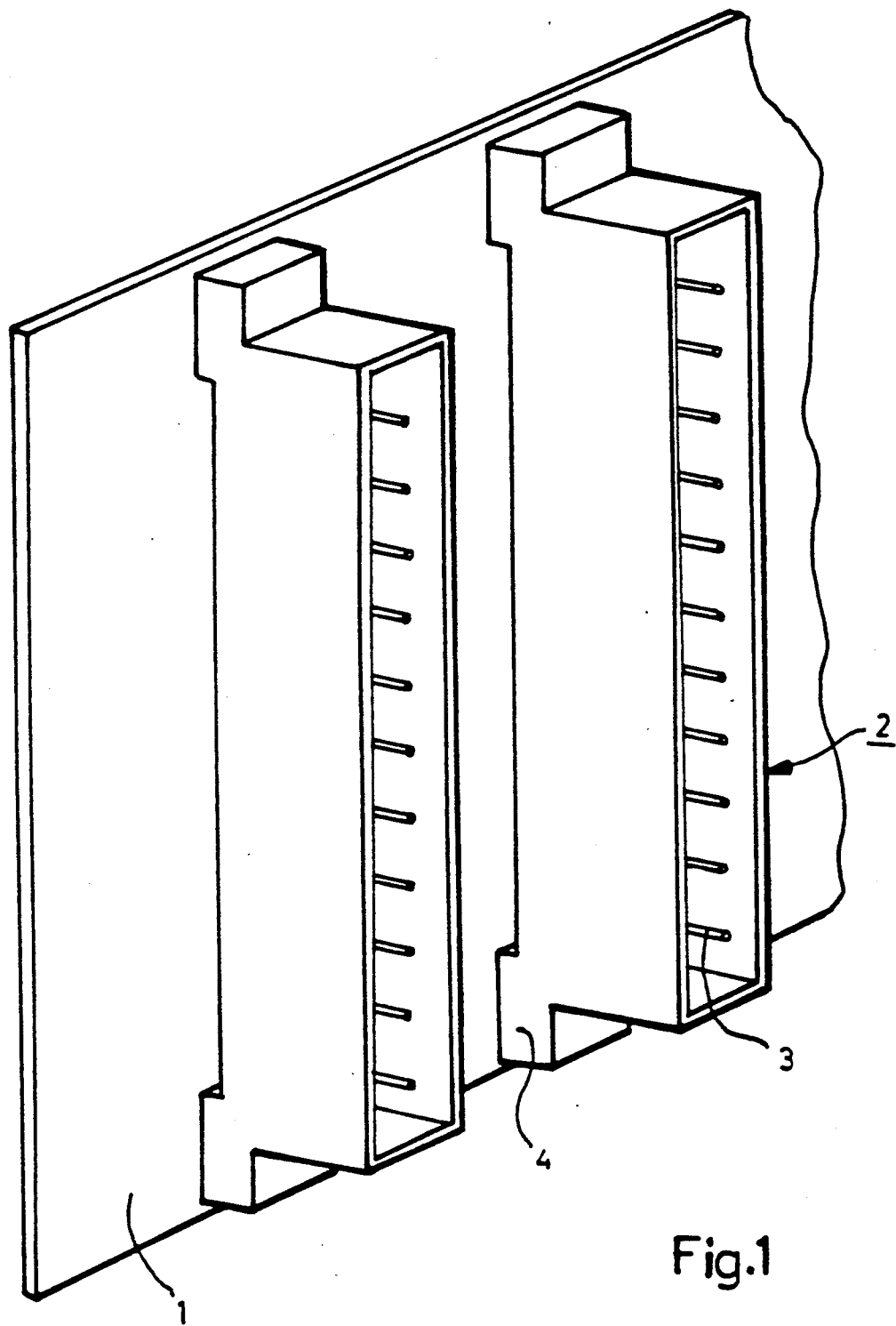
FIG. 1 is a perspective view of a PCB with connectors.

A known PCB 1 is illustrated in FIG. 1 and is provided with connectors 2 in which electrical connection pins 3 are fixed. The connectors 2 have end portions 4, the backs of which bear against the front of the PCB, and the connection pins 3 are thrust (in a way not illustrated in the Figure) into holes in the PCB 1 and connected to its electrical conductors. The PCB 1 is, as is described above, intended to be fastened to the back of a compartment, which has means for retaining daughter PCBs, which are connected to the PCB 1 via the connection pins 3 in the connectors 2.

Figure 2:
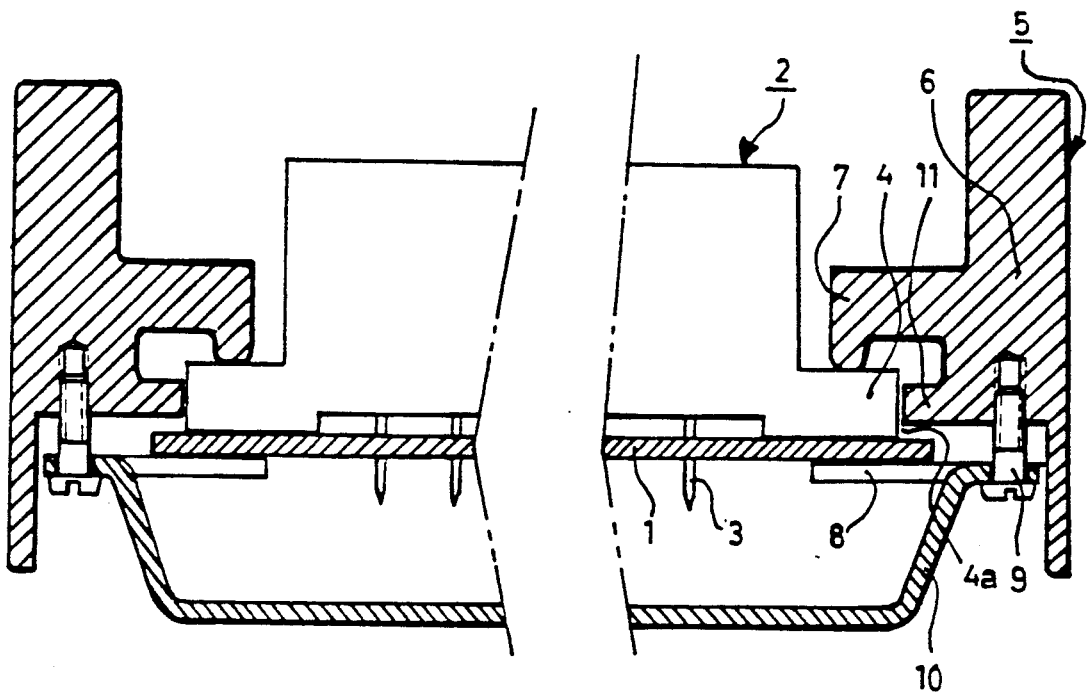
FIG. 2 is a cross section of a PCB with a connector retained in a frame by an inventive arrangement.

In FIG. 2 there is illustrated an inventive arrangement for retaining the PCB 1 in a frame 5, which is placed at the back of a compartment in an unillustrated manner. According to this embodiment the frame 5 includes elongate rails 6, mutually joined at their ends by transverse elements. The rails, which may be extruded aluminium sections, have a longitudinal tongue 7. This bears against the front of the end portion 4 of the connector 2, and behind the end portion on the back of the PCB 1 there is a movable support 8 attached to the rail 6 by a screw 9. The movable supports 8 at the ends of the connector 2 are mutually connected in this embodiment by a bridging member 10, which extends at a distance from the PCB 1. The connector 2 and PCB 1 are kept against the rail 6 by the movable supports 8 being kept in engagement against the back of the PCB 1 by the screws 9, and the PCB 1 transfers the forces from the screws 9 to the end portions 4, the fronts of which are kept in engagement against the tongue 7. In an advantageous embodiment, the rail 6 has a further longitudinal tongue 11, which engages against the outer side 4a of the end portion 4. With the aid of this tongue the connector 2 is kept in a desired position laterally in a simple way.

Figure 3:
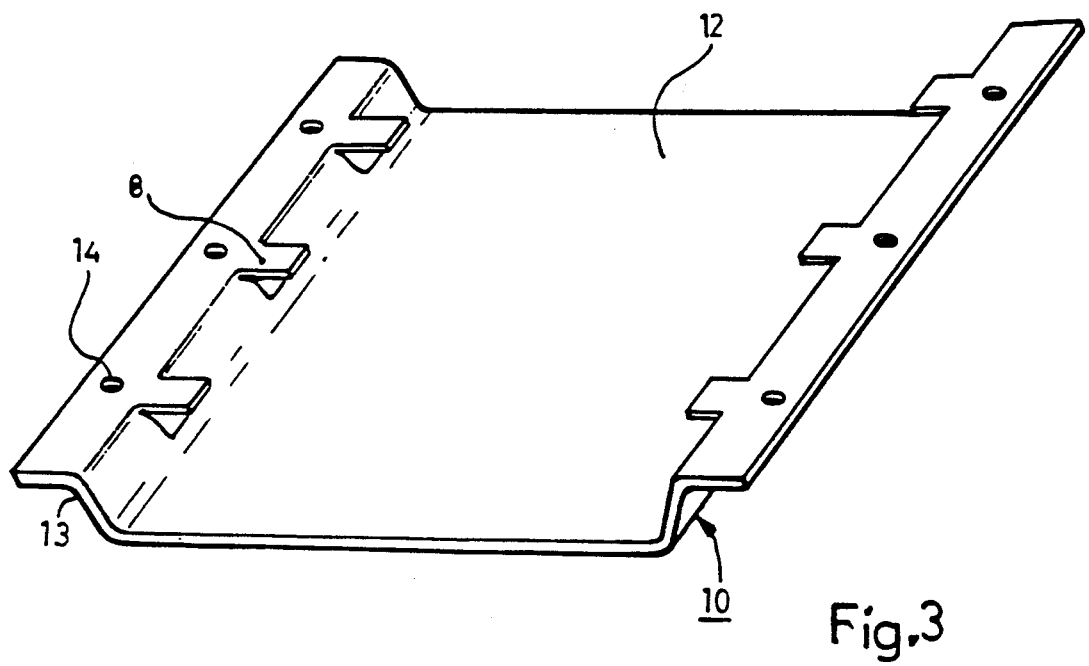
FIG. 3 is a perspective view of a part of the retaining means.

An advantageous embodiment of the displaceable supports 8 and the bridging member 10 is illustrated in FIG. 3. The bridging member comprises a plate, e.g. of metal, with a flat central part 12 and upwardly folded longitudinal sides 13 with flanges. The latter have holes 14 for the screws 9, and the movable supports 8 comprise flaps punched out and folded upwards from the sides 13.

Figure 4:
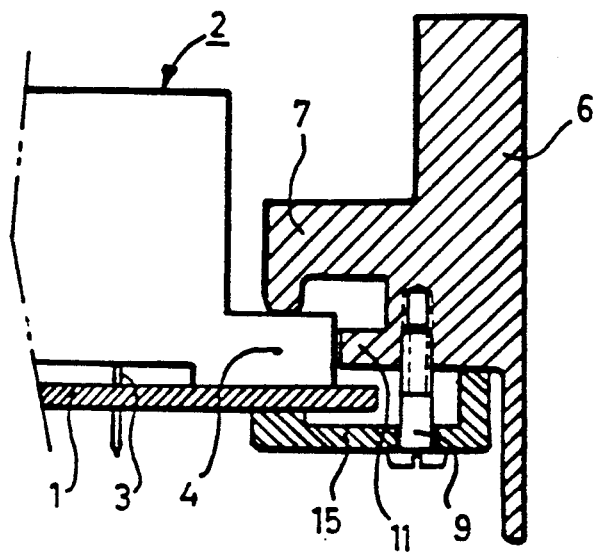
FIG. 4 is a cross section of an alternative embodiment of the retaining means.

An alternative embodiment of the invention is illustrated in FIG. 4. In the manner described in connection with FIG. 2, the front of the end portion 4 engages against the tongue 7 of the rail 6. The back of the end portion 4 bears against the front of the PCB 1 and on the back of the PCB, opposite the tongue 7, there is a displaceable support 15. The support 15 has a U-shaped cross-section, one flange of which engages against the rail 6 and the other flange engages against the back of the PCB 1. The support is kept against the rail 6 by the screw 9, with the aid of which the end portion 4 and PCB 1 are retained between the tongue 7 and support 15.

Figure 5:
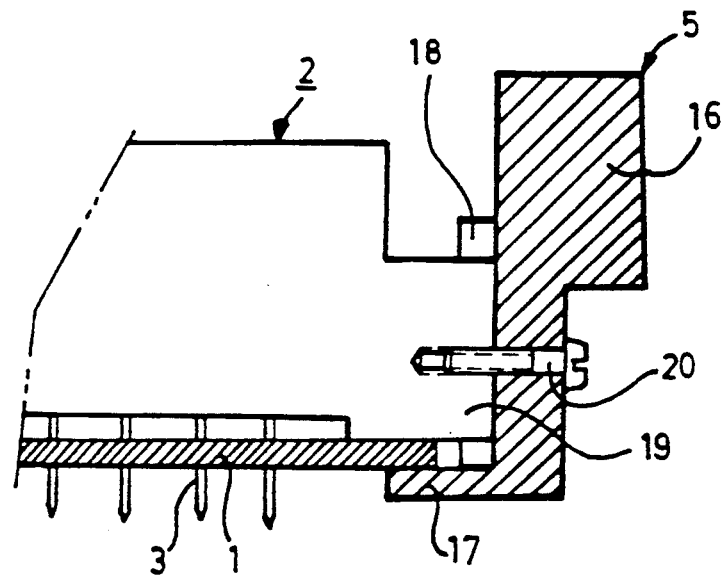
FIG. 5 is a cross section of a further embodiment of a retaining means and FIG. 6 is a perspective view of the retaining means in FIG. 5.
Figure 6:
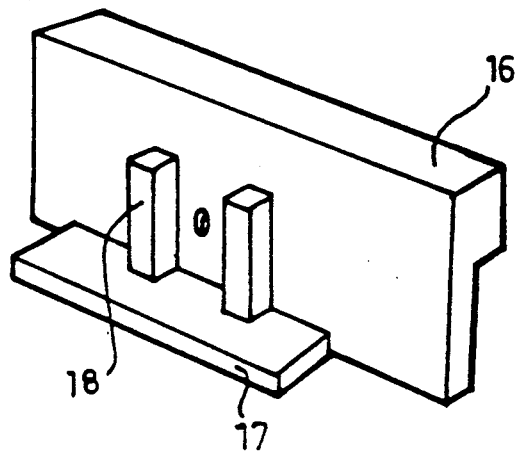

A further alternative embodiment of the invention is illustrated in FIGS. 5 and 6. The frame 5, which retains the PCB 1 and connector 2, has rails 16 with holders, which have a fixed flange-like support 17 arranged at the back of the rail 16, and two projections 18 on the side of the rail. The back of the PCB 1 engages against the front of the support 17, and the connector 2 has an end portion 19 inserted between the projections 18. The back of the end portion 19 engages against the front of the PCB 1, and the end portion 19 is retained against the rail 16 by a screw 20, which passes through a hole in the rail 16.

In the above-described arrangement for retaining the PCB 1 on the frame 5, the connectors 2 are also retained in the frame. The forces occurring when a daughter PCB is connected via the connector 2 to the PCB 1 are transmitted via the connector 2 directly to the frame. The PCB 1 can therefore be made thin. As mentioned above, the electrical connection pins 3 are thust into holes in the PCBs. These holes are achieved by drilling, which is done with great precision and is therefore expensive. To keep costs down, several PCBs are placed one on top of the other and are drilled in packs. The thinner the PCB the more PCBs can be drilled simultaneously while maintaining the required precision. This is of course a production advantage in manufacturing the circuit boards. A functional advantage can also be obtained for the PCB if its thickness can be kept small, since the PCB has many layers with electrical conductors and a certain capacitance occurs between the layers. This capacitance shall have a minimum magnitude for the PCB 1 to be well impedance-adapted.

The invention permits the PCB to be made so thin that this requirement for impedance adaptability is met.

We claim:

1. An arrangement for retaining a printed circuit board which has connectors connected thereto by electrical connection pins of the connectors which are connected to conductors of the printed circuit board, the connectors being elongate and having an end portion at either end thereof which has a back surface which bears against a front surface of the printed circuit board, said arrangement comprising:

a frame, said frame including supports bearing against a back surface of the printed circuit board and tongues bearing against front surfaces of the end portions of the connectors, wherein said supports bear on the printed circuit board in positions directly opposite the end portions of the connectors and thus said supports and said tongues retain the end portions of the connectors in desired positions, and wherein said supports are displaceable relative to said tongues on said frame, said frame further including bridging means, said bridging means extending along a back of the printed circuit board spaced from the printed circuit board, and connecting supports of said frame at first end portions of the connectors with supports of said frame at second, opposite end portions of the connectors.

2. An arrangement as claimed in claim 1, wherein said bridging means includes a flat central plate which is spaced from the printed circuit board.

3. An arrangement as claimed in claim 1, wherein said supports and said tongues are located on separate parts of said frame which are fastened together to form said frame.

* * * * *